(12) United States Patent
Gu et al.

(10) Patent No.: US 11,386,837 B2
(45) Date of Patent: Jul. 12, 2022

(54) DISPLAY SUBSTRATE AND MANUFACTURING METHOD THEREOF, AND DISPLAY APPARATUS

(71) Applicant: BOE TECHNOLOGY GROUP CO., LTD., Beijing (CN)

(72) Inventors: Renquan Gu, Beijing (CN); Qi Yao, Beijing (CN); Jaiil Ryu, Beijing (CN); Yingwei Liu, Beijing (CN); Zhiwei Liang, Beijing (CN); Muxin Di, Beijing (CN); Wusheng Li, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 17/254,088

(22) PCT Filed: Mar. 20, 2020

(86) PCT No.: PCT/CN2020/080303
§ 371 (c)(1),
(2) Date: Dec. 18, 2020

(87) PCT Pub. No.: WO2020/192561
PCT Pub. Date: Oct. 1, 2020

(65) Prior Publication Data
US 2021/0264852 A1 Aug. 26, 2021

(30) Foreign Application Priority Data
Mar. 27, 2019 (CN) .......................... 201910236760.5

(51) Int. Cl.
*G09G 3/3225* (2016.01)
*H01L 51/56* (2006.01)
*H01L 27/32* (2006.01)

(52) U.S. Cl.
CPC ....... *G09G 3/3225* (2013.01); *H01L 27/3244* (2013.01); *H01L 51/56* (2013.01); *H01L 2227/323* (2013.01)

(58) Field of Classification Search
CPC .... H01L 27/3244; H01L 51/56; G09G 3/3225
See application file for complete search history.

(56) References Cited

U.S. PATENT DOCUMENTS 10,163,940 B2 * 12/2018 Kubota ............. G02F 1/133305
10,692,799 B2 *  6/2020 Yueh .................. H01L 29/42372
(Continued)

FOREIGN PATENT DOCUMENTS

CN   104485349 A    4/2015
CN   105206625 A   12/2015
(Continued)

OTHER PUBLICATIONS

First Office Action dated Aug. 7, 2020, for corresponding Chinese application No. 201910236760.5.
(Continued)

*Primary Examiner* — Sardis F Azongha
(74) *Attorney, Agent, or Firm* — Nath, Goldberg & Meyer; Joshua B. Goldberg (57) ABSTRACT

A display substrate, a manufacturing method thereof and a display apparatus are provided. The display substrate includes a base substrate structure and a display structure on the base substrate structure, the display structure includes a plurality of light emitting units and is divided into multiple light-transmissive regions and multiple opaque regions; and a driving circuit for driving the display structure to display and comprising a pixel driving circuit between the base substrate structure and the display structure, and a peripheral circuit driving the pixel driving circuit and arranged on a side of the base substrate structure distal to the display
(Continued)

structure and in the opaque regions, and the peripheral circuit is coupled to the pixel driving circuit through at least one through hole formed in the base substrate structure. The display substrate can realize frameless display, which is beneficial to realize seamless splicing display of a plurality of display substrates.

14 Claims, 8 Drawing Sheets

(56) References Cited

U.S. PATENT DOCUMENTS

| 2010/0090995 | A1 | 4/2010 | Chung et al. | |
|---|---|---|---|---|
| 2020/0168682 | A1* | 5/2020 | Kishimoto | G09F 9/30 |
| 2021/0202530 | A1* | 7/2021 | Yao | H01L 27/124 |

FOREIGN PATENT DOCUMENTS

| CN | 206364016 U | 7/2017 | |
|---|---|---|---|
| CN | 108155220 A | 6/2018 | |
| CN | 207517684 U | 6/2018 | |
| CN | 108336106 A | 7/2018 | |
| CN | 208336216 U | 1/2019 | |
| CN | 109920804 A | 6/2019 | |
| WO | WO-2018223696 A1 * | 12/2018 | ........... H01L 27/124 |

OTHER PUBLICATIONS

Second Office Action dated Jan. 21, 2021 for corresponding Chinese application No. 201910236760.5.
Decision of Rejection dated Apr. 13, 2021, for corresponding Chinese application No. 201910236760.5.

* cited by examiner

Fig. 17

DISPLAY SUBSTRATE AND MANUFACTURING METHOD THEREOF, AND DISPLAY APPARATUS

CROSS-REFERENCE TO RELATED APPLICATIONS

This is a National Phase Application filed under 35 U.S.C. 371 as a national stage of PCT/CN2020/080303, filed Mar. 20, 2020, an application claiming the benefit of Chinese Application No. 201910236760.5, filed Mar. 27, 2019, the content of each of which is hereby incorporated by reference in its entirety.

TECHNICAL FIELD

The present disclosure relates to the field of display technology, and particularly relates to a display substrate and a manufacturing method thereof and a display apparatus.

BACKGROUND

With the development of display technology, the full-screen technology is gradually becoming the mainstream technology of a handheld apparatus such as a mobile phone nowadays. Currently, the GOA (Gate Driver On Array) is mainly used to narrow the left and right frames, and the COF (Chip On Film) is used to narrow the lower frame. Although the frames of the display screen become narrower and narrower, it is still impossible to realize a frameless display screen. In order to realize seamless display of a large-size spliced display screen, it is urgent to realize a truly frameless display screen.

SUMMARY

The disclosure provides a display substrate, a manufacturing method thereof and a display apparatus.

The display substrate of the present disclosure includes: a base substrate structure; a display structure being arranged above the base substrate structure, the display structure including a plurality of light emitting units and being divided into a plurality of light-transmissive regions and a plurality of opaque regions; and a driving circuit for driving the display structure to display; the driving circuit including a pixel driving circuit and a peripheral circuit, the pixel driving circuit being arranged between the base substrate structure and the display structure, and the peripheral circuit providing an electric signal for the pixel driving circuit; the peripheral circuit is arranged on a side of the base substrate structure distal to the display structure and located in the opaque regions of the display structure, and is coupled to the pixel driving circuit through at least one through hole formed in the base substrate structure.

In some embodiments, the display structure includes a plurality of light emitting units including inorganic light emitting diodes or organic light emitting diodes.

In some embodiments, the base substrate structure includes an insulation layer and a buffer layer, the insulation layer and the buffer layer are superposed on each other, the pixel driving circuit is disposed on a side of the buffer layer distal to the insulation layer, and the peripheral circuit is disposed on a side of the insulation layer distal to the buffer layer.

In some embodiments, the at least one through hole is provided with a conductive seed layer therein.

In some embodiments, the conductive seed layer is made of Ti, Mo, Ta, Al, Cu, Ag, Mo alloy, Cu alloy or AL alloy.

In some embodiments, the at least one through hole includes a plurality of through holes, and the plurality of through holes are respectively disposed in the plurality of opaque regions.

Another aspect of the present disclosure also provides a display apparatus including the above display substrate.

Another aspect of the present disclosure also provides a method for manufacturing the display substrate, including: forming a base substrate structure on a substrate; forming a pixel driving circuit and a display structure in the base substrate structure sequentially such that the display structure includes a plurality of light emitting units, and is divided into a plurality of light-transmissive regions and a plurality of opaque regions; forming at least one through hole in the base substrate structure; and forming a peripheral circuit on a side of the base substrate structure distal to the display structure such that the peripheral circuit is located in the opaque regions of the display structure and is configured to provide an electric signal for the pixel driving circuit.

In some embodiments, the forming a base substrate structure on a substrate includes: forming an insulation layer and a buffer layer on the substrate sequentially.

In some embodiments, the forming a pixel driving circuit and a display structure on the base substrate structure sequentially includes: forming the pixel driving circuit on a side of the buffer layer distal to the insulation layer, and forming the display structure on the pixel driving circuit.

In some embodiments, after the forming a pixel driving circuit and a display structure on the base substrate structure sequentially, the method further includes: turning over the substrate, and attaching the display structure to a UV curable adhesive such that the UV curable adhesive is arranged on a side of the display structure distal to the base substrate structure; separating the substrate from the base substrate structure by a laser lift-off process.

In some embodiments, the forming at least one through hole in the base substrate structure includes: forming a pattern of the at least one through hole by performing a dry etching process on the base substrate structure with a mask plate having a through hole pattern; depositing a conductive seed layer on the base substrate structure, and performing a patterning process on the conductive seed layer to remain the conductive seed layer at a region where the at least one through hole is located, and remove the conductive seed layer at a region other than the region where the at least one through hole is located; and forming a conductive film layer on the substrate structure by an electroplating process such that the conductive film layer is correspondingly formed at the region where the at least one through hole is located, and the at least one through hole is filled by the conductive film layer.

In some embodiments, after the peripheral circuit is coupled to the pixel driving circuit through the at least one through hole, the method includes: separating the display structure from the UV curable adhesive by UV illumination.

In some embodiments, after the forming an insulation layer and a buffer layer on the substrate sequentially and before the forming a pixel driving circuit and a display structure on the base substrate structure sequentially, the method further includes: turning over the substrate, and attaching the buffer layer to a UV (ultraviolet) curable adhesive such that the UV curable adhesive is arranged on a side of the buffer layer distal to the insulation layer, and separating the substrate from the base substrate structure by a laser lift-off process.

In some embodiments, the forming at least one through hole in the base substrate structure includes: forming a pattern of the at least one through hole by performing a dry etching process on the base substrate structure with a mask plate having a through hole pattern; depositing a conductive seed layer on the substrate structure and performing a patterning process on the conductive seed layer to remain the conductive seed layer at a region where the at least one through hole is located, and remove the conductive seed layer at a region other than the region where the at least one through hole is located; and forming a conductive film layer on the base substrate structure by an electroplating process such that the conductive film layer is correspondingly formed at the region where the at least one through hole is located, and the at least one through hole is filled by the conductive film layer.

In some embodiments, after the forming a peripheral circuit on a side of the base substrate structure distal to the display structure and before the forming the pixel driving circuit and the display structure on the base substrate structure sequentially, the method further includes: separating the buffer layer from the UV curable adhesive by UV illumination.

In some embodiments, the conductive seed layer is made of Ti, Mo, Ta, Al, Cu, Ag, Mo alloy, Cu alloy or AL alloy.

In some embodiments, the forming at least one through hole in the base substrate structure includes forming a plurality of through holes in the base substrate structure such that the plurality of through holes are respectively disposed in the plurality of opaque regions.

DETAILED DESCRIPTION

In order to make a person skilled in the art better understand the technical solution of the present disclosure, a display substrate, a method for manufacturing the display substrate, and a display apparatus provided in the present disclosure are described in further detail below with reference to the accompanying drawings and the detailed description.

Unless defined otherwise, technical or scientific terms used herein should have the same meaning as commonly understood by a person skilled in the art to which this disclosure belongs. The use of "first", "second", and the like in this disclosure is not intended to indicate any order, quantity, or importance, but rather is used to distinguish one element from another. The word "comprising", "comprises", or the like, means that the element or item preceding the word comprises the element or item listed after the word and the equivalent thereof, but does not exclude other elements or items. "Upper", "lower", "left", "right", and the like are used only to indicate relative positional relationships, and when the absolute position of the object being described is changed, the relative positional relationships may also be changed accordingly.

The inventor of the present disclosure finds that, in the related art, GOA (Gate Driver On Array) is mainly used to realize narrowing the left and right frames, and COF (Chip On Film) is used to realize narrowing the lower frame. Although the frame of the display screen becomes narrower and narrower, it is still impossible to realize a frameless display screen, which affects the user's experience.

Therefore, it is expected to provide a display substrate, a manufacturing method thereof and a display apparatus, which can realize frameless display.

Figure 1A:
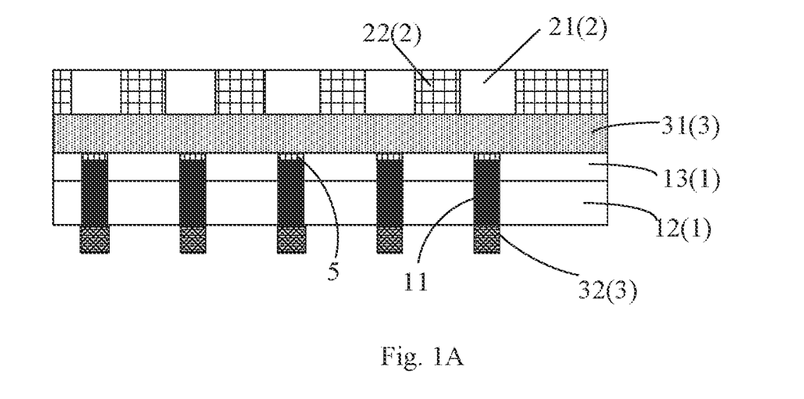
FIG. 1A is a schematic structural view of a display substrate according to some embodiments of the disclosure.

According to an embodiment of the present disclosure (as shown in FIG. 1A), there is provided a display substrate including: a base substrate structure 1 and a display structure 2 disposed above the base substrate structure 1, the display structure 2 including a plurality of light emitting units. The display structure 2 is divided into a plurality of light-transmissive regions 22 and a plurality of opaque regions 21 (only one of the plurality of light-transmissive regions and one of the plurality of opaque regions are marked with annotations in the figure), the display substrate further including a driving circuit 3 for driving the display structure 2 to display, the driving circuit 3 including a pixel driving circuit 31 and a peripheral circuit 32, the pixel driving circuit 31 is configured to provide a driving signal to the light emitting unit, the pixel driving circuit 31 is disposed between the base substrate structure 1 and the display structure 2, the peripheral circuit 32 is configured to drive the pixel driving circuit 31 to provide an electrical signal to the pixel driving circuit 31, the peripheral circuit 32 is disposed on a side of the base substrate structure 1 distal to the display structure 2, the peripheral circuit 32 is located in the opaque regions 21 of the display structure 2, and the peripheral circuit 32 is located in the orthographic projection region of the display structure 2 on the base substrate structure 1, and the peripheral circuit 32 is coupled to the pixel driving circuit 31 through a through hole formed in the base substrate structure 1.

The light-transmissive regions 22 of the display structure 2 refers to pixel regions of the display structure 2, i.e. regions for setting the plurality of light emitting units, and as for a micro-inorganic light emitting diode display structure, the pixel regions are the regions for setting micro-inorganic light emitting diodes, and the opaque regions 21 are the regions except the regions for setting the micro-inorganic light emitting diodes, and are usually used for setting data lines, gate lines, TFTs, and the like. The peripheral circuit 32 is disposed in the opaque regions 21 of the display structure 2, so that the light-transmissive regions 22 of the display structure 2 are not shielded by the peripheral circuit 32, and the influence of the setting of the peripheral circuit 32 on a normal display of the display structure 2 can be avoided. And the influence on an aperture ratio of the display substrate can be avoided.

The peripheral circuit 32 is configured to drive the pixel driving circuit 31, and the peripheral circuit 32 may include a gate driving circuit, a data line driving circuit, and some other control circuits. In the related art, the peripheral circuit 32 is generally disposed in a frame region of the display substrate.

Figure 1B:
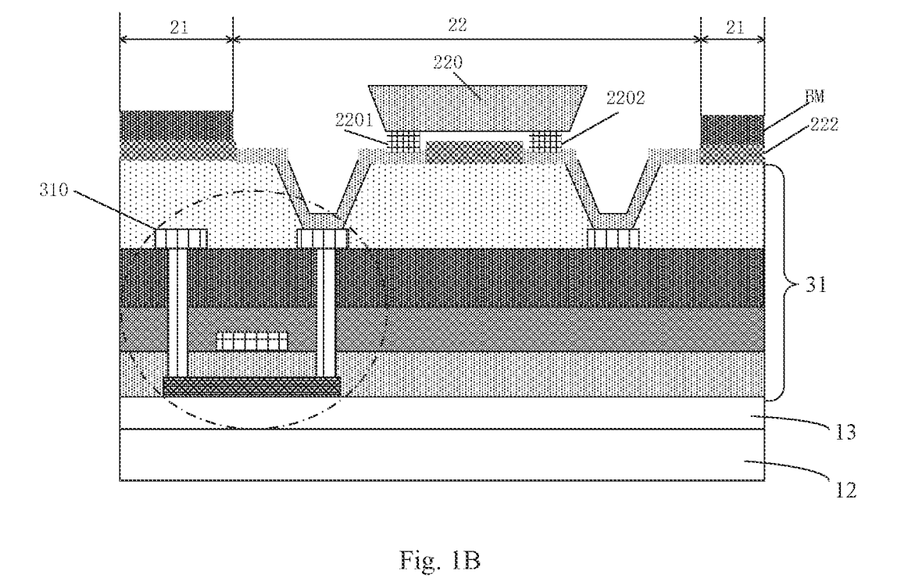
FIG. 1B is a schematic structural view of a display substrate according to some embodiments of the disclosure.

FIG. 1B shows a schematic structural view of the display structure 2 and the pixel driving circuit 31 disposed on the base substrate structure with an insulation layer 12 and a buffer layer 13 in some embodiments of the present disclosure. One of the plurality of light-transmissive regions 22 of the display structure 2 includes a light emitting element 220 and a first electrode 2201 and a second electrode 2202 of the light emitting element 220. One of the plurality of opaque regions 21 of the display structure 2 includes a light-shielding pattern or an opaque pattern, such as a black matrix BM, disposed on a same layer as the light emitting unit. The pixel driving circuit 31 includes at least one thin film transistor 310 coupled to the light emitting element, and a drain of the thin film transistor 310 is coupled to the first electrode 2201 of the light emitting unit 220 to supply an electrical signal to the light emitting unit 220. The insulation layer 222 is used to insulate and separate the conductive patterns, which are not electrically coupled to each other, from each other.

By setting the peripheral circuit 32 of the driving circuit 3, which is conventionally arranged in the frame region of the display substrate as in the prior art, on the side of the base substrate structure 1 distal to the display structure 2, and making the peripheral circuit 32 be located in an orthographic projection of the display structure 2 on the base substrate structure 1, the peripheral circuit 32 is no longer required to occupy the frame region of the display substrate and the frameless display of the display substrate can be achieved, which is beneficial to realize the seamless display of the display substrate.

In some embodiments of the present disclosure, the display structure 2 includes a plurality of light emitting units, which are arranged in an array. The light emitting units include inorganic light emitting diodes or organic light emitting diodes, that is, the display substrate is an inorganic light emitting diode display substrate or an organic light emitting diode display substrate. In some embodiments of the present disclosure, the light emitting units are micro-inorganic light emitting diodes.

In some embodiments of the present disclosure, the base substrate structure 1 includes an insulation layer 12 and a buffer layer 13, the insulation layer 12 and the buffer layer 13 are superposed on each other, the pixel driving circuit 31 is disposed on a side of the buffer layer 13 distal to the insulation layer 12, and the peripheral circuit 32 is disposed on a side of the insulation layer 12 distal to the buffer layer 13. The buffer layer 13 is made of an insulation material, which is beneficial to the manufacturing of the pixel driving circuit 31, i.e. the pixel driving circuit 31 may be well formed on the buffer layer 13. The insulation layer 12 is made of a flexible material (e.g., polyimide), which facilitates flexible display of the display substrate, and enables the peripheral circuits 32 to be well formed thereon.

It should be noted that, in some embodiments of the present disclosure, signal lines or signal terminals of the pixel driving circuit 31 for being coupled to the peripheral circuit 32 may be directly disposed on the buffer layer 13, or may be disposed on any insulation film layer on the buffer layer 13. When the signal lines or the signal terminals of the pixel driving circuit 31 for being coupled to the peripheral circuit 32 are directly disposed on the buffer layer 13, electrical connection between the pixel driving circuit 31 and the peripheral circuit 32 can be achieved through the through hole 11 formed in the base substrate structure 1, as shown in FIG. 1A; when the signal lines or signal terminals of the pixel driving circuit 31 for being coupled to the peripheral circuit 32 are disposed on any insulation film layer on the buffer layer 13, the through hole 11 formed in the base substrate structure 1 is required to extend through the insulation film layer below the signal lines or signal terminals, so as to couple the pixel driving circuit 31 to the peripheral circuit 32 (not shown in the figure).

Based on the above structure of the display substrate, this embodiment further provides a method for manufacturing the display substrate, including: preparing a substrate, such as a glass substrate 7; forming a base substrate structure 1 on the glass substrate 7; and forming a pixel driving circuit 31 and a display structure 2 on the base substrate structure 1 sequentially such that the display structure 2 includes a plurality of light emitting units, and the display structure 2 is divided into a plurality of light-transmissive regions 22 and a plurality of opaque regions 21; the method for manufacturing the display substrate further includes: forming a through hole 11 in the base substrate structure 1; and forming a peripheral circuit 32 on a side of the base substrate structure distal to the display structure such that the peripheral circuit 32 is located in the opaque regions 21 of the display structure 2 and is located in an orthographic projection of the display structure 2 on the base substrate structure 1, and the peripheral circuit 32 is coupled to the pixel driving circuit 31 through the through hole 11.

Figure 9:
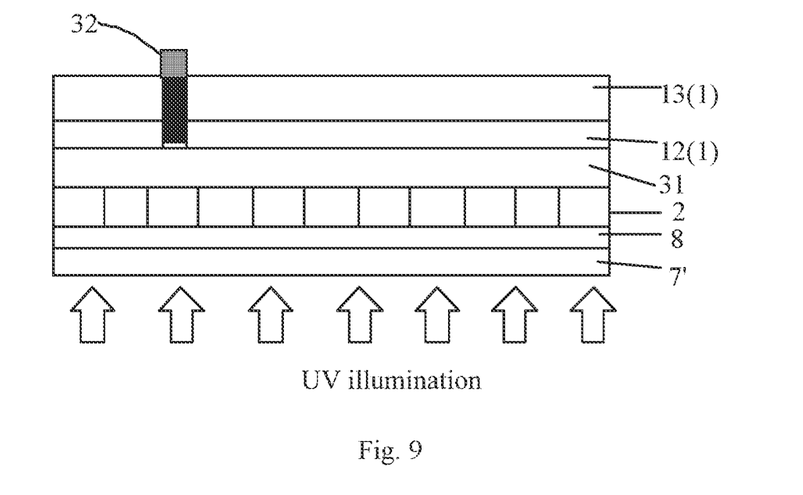
FIG. 9 is a schematic cross-sectional structural view illustrating a step S206 of a process of a method for manufacturing a display substrate according to some embodiments of the present disclosure.
Figure 10:
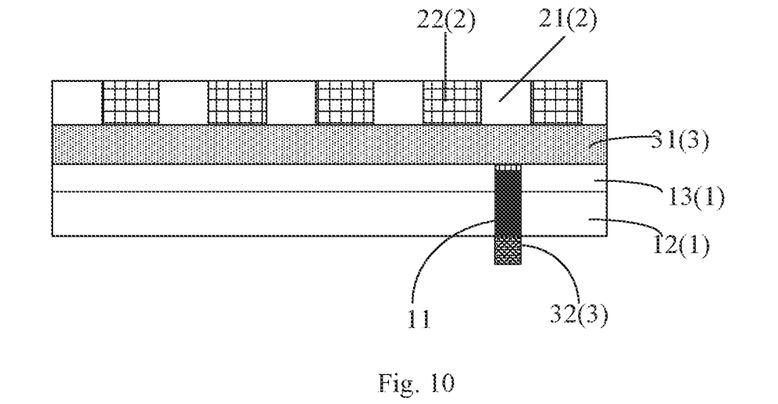
FIG. 10 is a schematic cross-sectional structural view illustrating a step S206 of a process of a method for manufacturing a display substrate according to some embodiments of the present disclosure.
Figure 11:
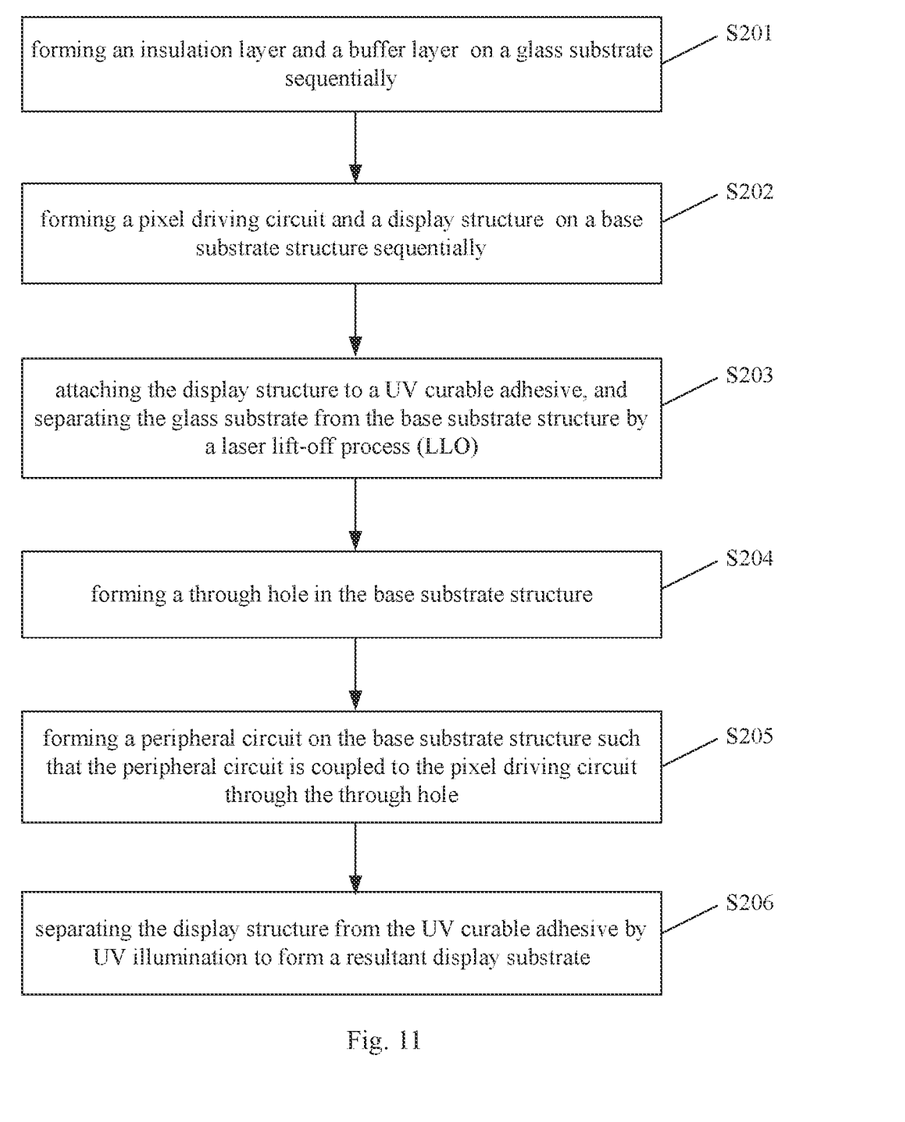
FIG. 11 is a process flow chart of a method of manufacturing a display substrate according to an embodiment of the present disclosure.
Figure 12:
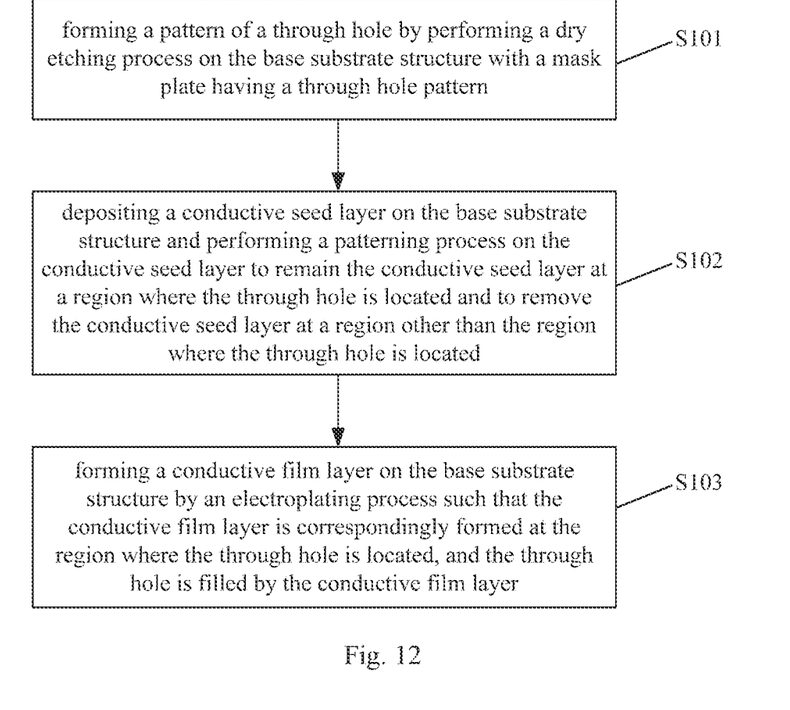
FIG. 12 is a flow chart of a method of forming a through hole in a base substrate structure according to an embodiment of the present disclosure.

In some embodiments of the present disclosure, the method for manufacturing a display substrate includes the following steps S201 to S206, FIG. 2 to FIG. 10 are schematic structural cross-sectional views of the processes of the method for manufacturing a display substrate according to some embodiments, and FIG. 11 is a process flow chart of the method for manufacturing a display substrate according to some embodiments.

Figure 2:
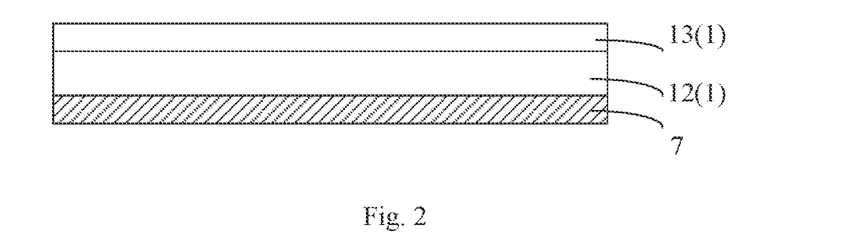
FIG. 2 is a schematic cross-sectional structural view illustrating a step S201 of a process of a method for manufacturing a display substrate according to some embodiments of the present disclosure.

Step S201: forming a base substrate structure 1 including an insulation layer 12 and a buffer layer 13 sequentially on the glass substrate 7, as shown in FIG. 2.

Figure 3:
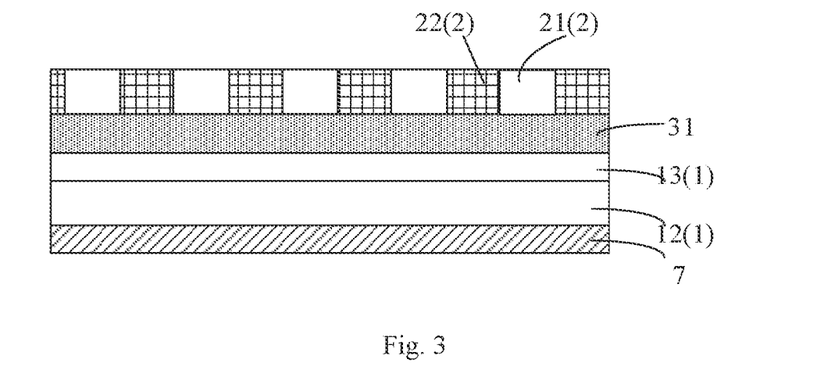
FIG. 3 is a schematic cross-sectional structural view illustrating a step S202 of a process of a method for manufacturing a display substrate according to some embodiments of the present disclosure.

Step S202: forming a pixel driving circuit 31 and a display structure 2 sequentially on the base substrate structure 1, as shown in FIG. 3.

In this step, the pixel driving circuit 31 is disposed on a side of the buffer layer 13 distal to the insulation layer 12, and the display structure 2 is formed on the pixel driving circuit 31. The processes of forming the pixel driving circuit 31 and the display structure 2 are well known in the art and will not be described herein.

Figure 4:
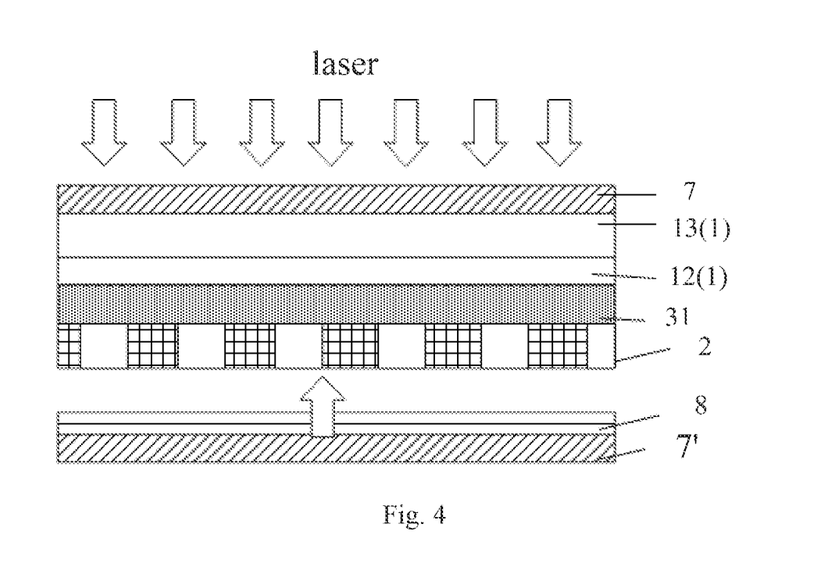
FIG. 4 is a schematic cross-sectional structural view illustrating a step S203 of a process of a method for manufacturing a display substrate according to some embodiments of the present disclosure.

Step S203: attaching the display structure 2 to a UV curable adhesive 8, and separating the glass substrate 7 from the base substrate structure 1 by a laser lift-off process (LLO), as shown in FIG. 4.

In the step, firstly, the glass substrate 7 is turned over, the display structure 2 with a plurality of micro-inorganic light emitting diodes is attached to the UV curable adhesive 8, the UV curable adhesive 8 is adhered to a glass substrate 7' in advance, and then the glass substrate 7 is separated from the base substrate structure 1 on a side of the base substrate structure 1 by a laser lift-off process (LLO).

Figure 5:
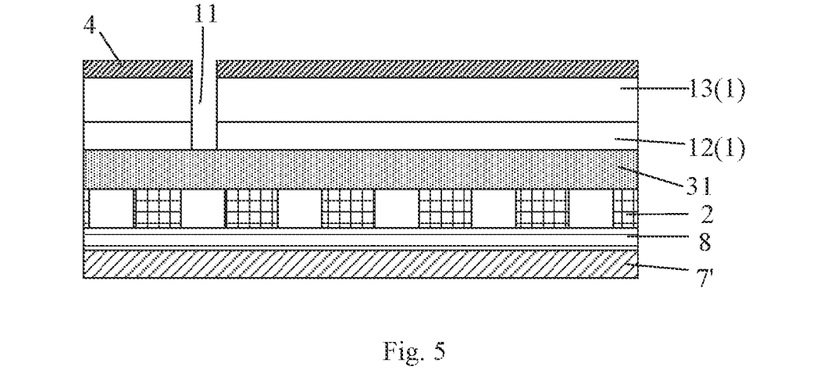
FIG. 5 is a schematic cross-sectional structural view illustrating a step S101 of forming a through hole in a base substrate structure according to some embodiments of the present disclosure.

Step S204: forming a through hole 11 in the base substrate structure 1, as shown in FIG. 5.

In this step, the forming a through hole 11 specifically includes the following steps S101 to S103, as shown in FIGS. 5 to 7, and FIG. 12 shows a flow chart of a method for forming a through hole in a base substrate structure in an embodiment.

Step S101: forming a pattern of a through hole by performing a dry etching process on the base substrate structure 1 with a silicon oxide or silicon nitride mask plate 4 having a through hole pattern. The dry etching process is a relatively mature process, and is not described herein again.

Figure 6:
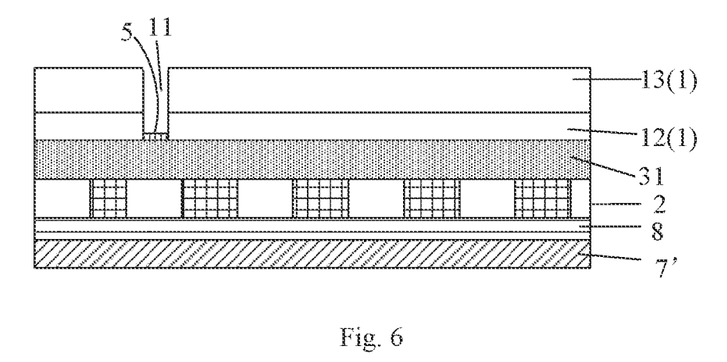
FIG. 6 is a schematic cross-sectional structural view illustrating a step S102 of forming a through hole in a base substrate structure according to some embodiments of the present disclosure.

Step S102: depositing a conductive seed layer 5 on the base substrate structure 1 subjected to the above step, performing a patterning process on the conductive seed layer 5 to remain the conductive seed layer 5 at a region where the through hole 11 is located and remove the conductive seed layer at a region other than the region where the through hole 11 is located, where the through hole 11 is located in the opaque region 21 of the display structure 2.

The conductive seed layer 5 is made of a conductive metal material such as a simple metal substance of Ti, Mo, Al, Cu, Ag or the like, and a metal alloy of Mo alloy, Cu alloy, Al alloy, or the like.

Figure 7:
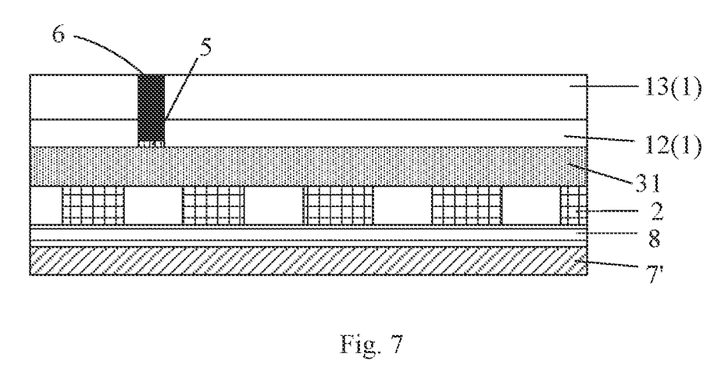
FIG. 7 is a schematic cross-sectional structural view illustrating a step S103 of forming a through hole in a base substrate structure according to some embodiments of the present disclosure.

Step S103: forming a conductive film layer 6 on the base substrate structure 1 subjected to the above step by an electroplating process such that the conductive film layer 6 is formed at the region where the through hole 11 is located, and the through hole 11 is filled by the conductive film layer 6.

The conductive film layer 6 is made of a metal conductive material. For example, a material of the conductive film layer 6 is the same as that of the conductive seed layer 5.

Figure 8:
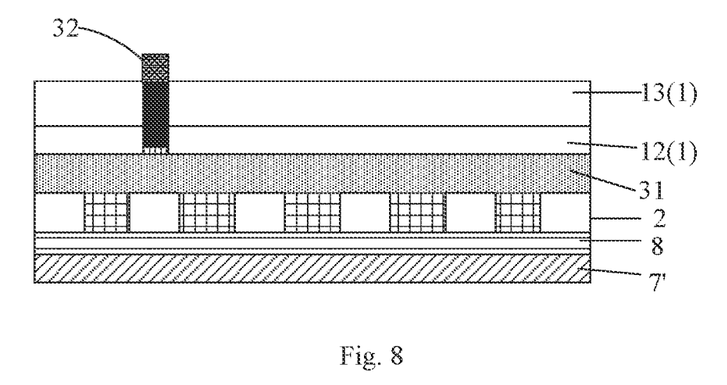
FIG. 8 is a schematic cross-sectional structural view illustrating a step S205 of a process of a method for manufacturing a display substrate according to some embodiments of the present disclosure.

Step S205: forming a peripheral circuit 32 on the base substrate structure 1 Such that the peripheral circuit 32 is coupled to the pixel driving circuit 31 through the through hole 11.

Step S206: finally, separating the display structure 2 from the UV curable adhesive 8 by UV illumination to form a resultant display substrate. It should be noted that, this embodiment is only exemplified by a method for manufacturing one through hole, the display substrate 1 may have multiple through holes 11, which are respectively disposed in the plurality of opaque regions 21, and the number of the through holes 11 may be set according to actual needs.

Figure 15:
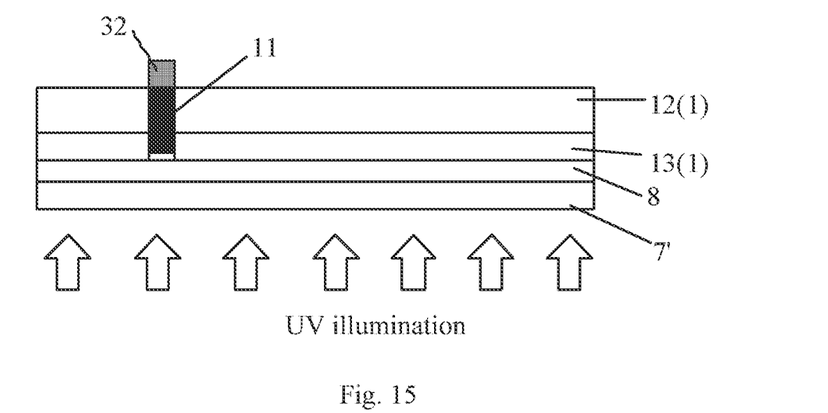
FIG. 15 is a schematic cross-sectional structural view illustrating a step S205' of a process of a method for manufacturing a display substrate according to an embodiment of the present disclosure.
Figure 16:
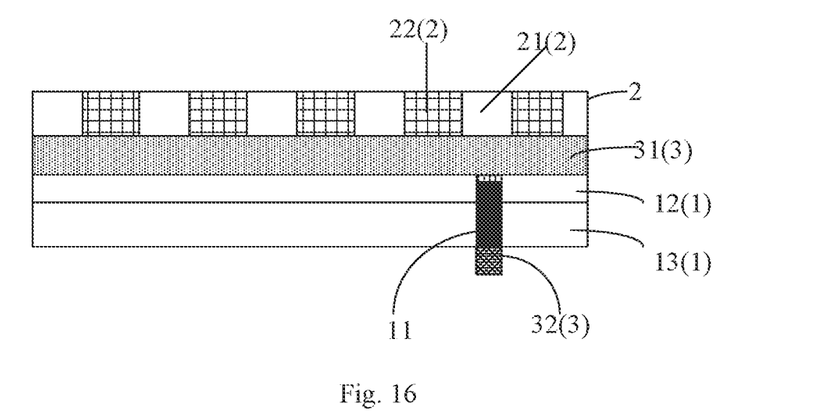
FIG. 16 is a schematic cross-sectional structural view illustrating a step S206' of a process of a method for manufacturing a display substrate according to an embodiment of the present disclosure.
Figure 17:
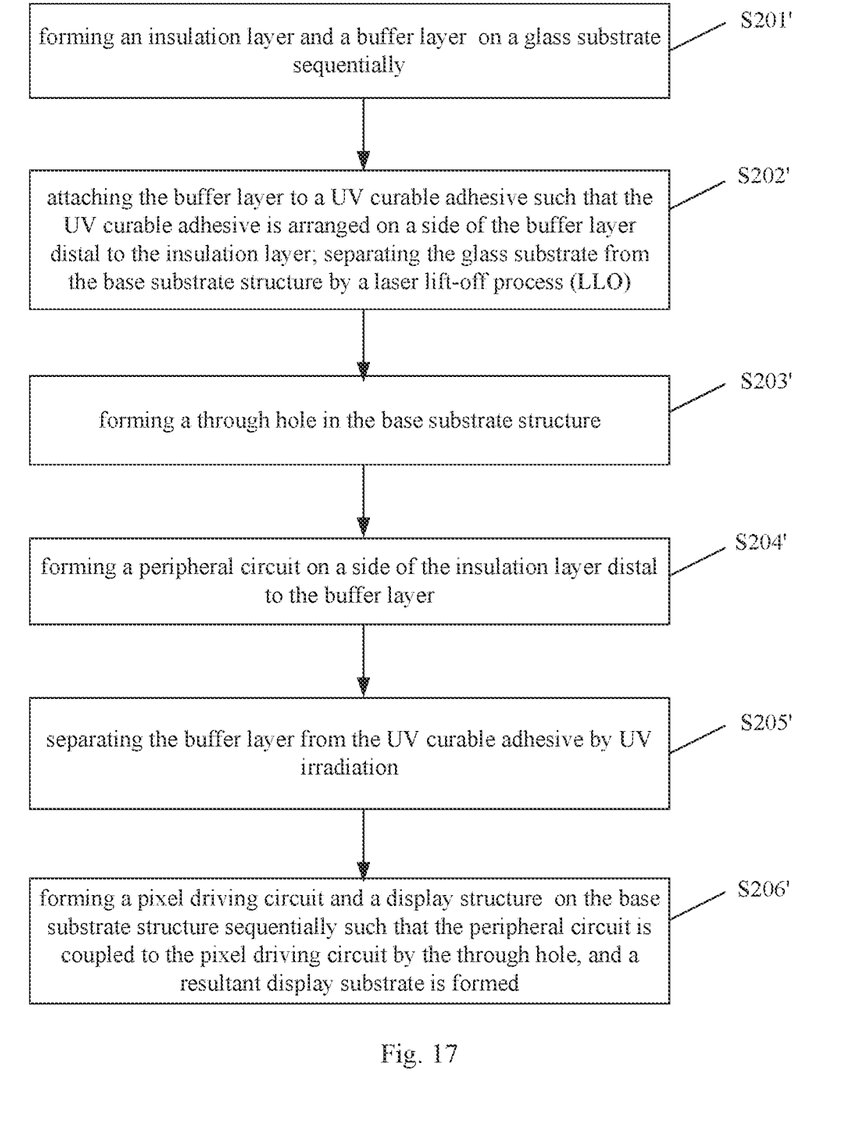
FIG. 17 is a process flow chart of a display substrate manufacturing method according to an embodiment of the present disclosure.

In an embodiment, the processes of the method for manufacturing a display substrate may alternatively include the following steps S201' to S206', FIGS. 13 to 16 are schematic structural cross-sectional views illustrating the processes of the method for manufacturing a display substrate according to an embodiment, and FIG. 17 is a process flow chart of the method for manufacturing a display substrate according to an embodiment.

Figure 13:
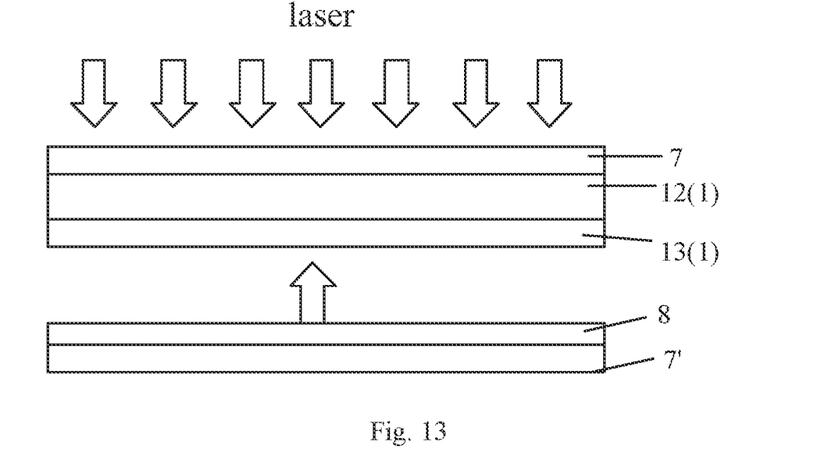
FIG. 13 is a schematic cross-sectional structural view illustrating a step S202' of a process of a method for manufacturing a display substrate according to some embodiments of the present disclosure.
Figure 14:
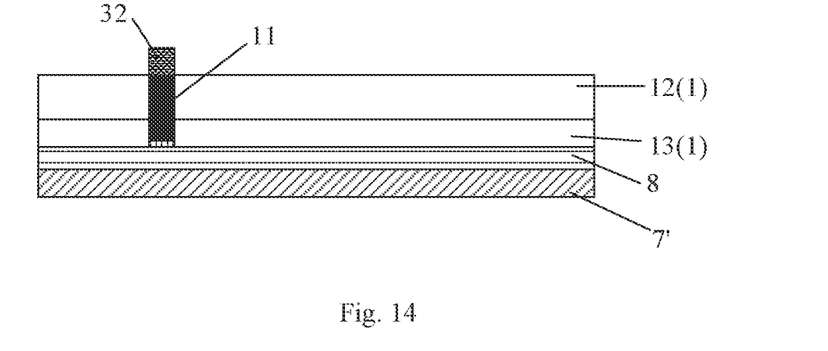
FIG. 14 is a schematic cross-sectional structural view illustrating a step S204' of a process of a method for manufacturing a display substrate according to an embodiment of the present disclosure.

Step S201': forming an insulation layer 12 and a buffer layer 13 sequentially on a glass substrate 7, as shown in FIG. 13;

Step S202': attaching the buffer layer 13 to a UV curable adhesive 8 such that the UV curable adhesive 8 is arranged on a side of the buffer layer 13 distal to the insulation layer 12; separating the glass substrate 7 from the base substrate structure 1 by a laser lift-off (LLO) process, as in FIGS. 13-15;

In the step, firstly, the glass substrate 7 is turned over, the buffer layer 13 is attached to the UV curable adhesive 8, the UV curable adhesive 8 is adhered to the glass substrate 7' in advance, and then the glass substrate 7 is separated from the base substrate structure 1 on a side of the base substrate structure 1 by a laser lift-off process (LLO).

Step S203': forming a through hole 11 in the base substrate structure 1, and the forming a through hole 11 is as above and will not be described again.

Step S204': forming a peripheral circuit 32 on a side of the insulation layer 12 distal to the buffer layer 13;

Step S205': separating the buffer layer 13 from the UV curable adhesive 8 by UV irradiation;

Step S206': forming a pixel driving circuit 31 and a display structure 2 sequentially on the base substrate structure 1 such that the peripheral circuit 32 is coupled to the pixel driving circuit 31 by the through hole 11, and a resultant display substrate is formed.

In this step, firstly, the base substrate structure 1 is turned over, the pixel driving circuit 31 is formed on the side of the buffer layer 13 distal to the insulation layer 12, and the display structure 2 is formed on the pixel driving circuit 31. It should be noted that, this embodiment is only exemplified by a method for manufacturing one through hole. The display substrate 1 may include multiple through holes, which are respectively disposed in the plurality of opaque regions 21, and the number of the through holes 11 may be set according to actual needs.

In some embodiments, the display structure includes a plurality of light emitting units, each of which may include an LED or an OLED. That is, the display substrate is an inorganic light emitting diode display substrate or an organic light emitting diode display substrate.

The plurality of light emitting units are arranged in an array. The configuration of the display structure is relatively known in the prior art, and is not described herein again.

Other structures of the display substrate and the manufacturing method thereof in some embodiments of the present disclosure are the same as those in the above embodiments, and are not repeated herein.

With the display substrate provided in the embodiment, by setting the peripheral circuit of the driving circuit, which is conventionally arranged in the frame region of the display substrate as in the prior art, on the side of the base substrate structure distal to the display structure, and making the peripheral circuit be located in an orthographic projection of the display structure on the base substrate structure, the peripheral circuit is no longer required to occupy the frame region of the display substrate and the frameless display of the display substrate can be achieved, which is beneficial to realize the seamless display of the display substrate.

The embodiment provides a display apparatus, which comprises the display substrate. With the display substrate, the display apparatus can realize frameless display, which is beneficial to realize seamless splicing display of the display apparatus.

The display apparatus provided by the disclosure may be any product or component with display function, such as an OLED panel, an OLED television, a display, a mobile phone, a navigator and the like, and may also be a semi-finished product of the product or component with the display function.

It will be understood that the above embodiments are merely exemplary embodiments employed to illustrate the principles of the present disclosure, and the present disclosure is not limited thereto. It will be apparent to a person skilled in the art that various changes and modifications can be made therein without departing from the spirit and scope of the disclosure, and these changes and modifications are to be considered within the scope of the disclosure.

What is claimed is:

1. A display substrate, comprising:
a base substrate structure;
a display structure arranged on the base substrate structure, the display structure comprising a plurality of light emitting units, and being divided into a plurality of light-transmissive regions and a plurality of opaque regions; and
a driving circuit, which is configured to drive the display structure to display and comprises a pixel driving circuit and a peripheral circuit, the pixel driving circuit being arranged between the base substrate structure and the display structure, and the peripheral circuit providing an electrical signal to the pixel driving circuit;
wherein the peripheral circuit is arranged on a side of the base substrate structure away from the display structure and located in the plurality of opaque regions of the display structure, and the peripheral circuit is coupled to the pixel driving circuit through at least one through hole formed in the base substrate structure;
wherein the base substrate structure comprises an insulation layer and a buffer layer, the insulation layer and the buffer layer are superposed on each other, the pixel driving circuit is disposed on a side of the buffer layer away from the insulation layer, and the peripheral circuit is disposed on a side of the insulation layer away from the buffer layer; and
wherein the at least one through hole is provided with a conductive seed layer therein, and the conductive seed layer is provided in the buffer layer on a side close to the pixel driving circuit.

2. The display substrate according to claim 1, wherein the plurality of light emitting units comprise inorganic light emitting diodes or organic light emitting diodes.

3. The display substrate according to claim 1, wherein the conductive seed layer is made of Ti, Mo, Ta, Al, Cu, Ag, Mo alloy, Cu alloy or AL alloy.

4. The display substrate according to claim 1, wherein the at least one through hole comprises a plurality of through holes, and the plurality of through holes are respectively disposed in the plurality of opaque regions.

5. A display apparatus comprising the display substrate of claim 1.

6. A method for manufacturing a display substrate, comprising:
forming a base substrate structure on a substrate;
forming a pixel driving circuit and a display structure on the base substrate structure sequentially such that the display structure comprises a plurality of light emitting units, and the display structure is divided into a plurality of light-transmissive regions and a plurality of opaque regions;
wherein the method further comprises:
forming at least one through hole in the base substrate structure; and
forming a peripheral circuit on a side of the base substrate structure away from the display structure such that the peripheral circuit is coupled to the pixel driving circuit through the at least one through hole, and the peripheral circuit is located in the plurality of opaque regions of the display structure and is configured to provide an electric signal to the pixel driving circuit;
wherein the forming a base substrate structure on a substrate comprises: forming an insulation layer and a buffer layer on the substrate sequentially; and
wherein the forming at least one through hole in the base substrate structure comprises:
forming a pattern of the at least one through hole by performing a dry etching process on the base substrate structure with a mask plate having a through hole pattern;
depositing a conductive seed layer on the base substrate structure and performing a patterning process on the conductive seed layer to remain the conducive seed layer at a region where the at least one through hole is located and remove the conductive seed layer at a region other than the region where the at least one through hole is located such that the conductive seed layer is provided in the buffer layer on a side close to the pixel driving circuit; and
forming a conductive film layer on the base substrate structure by an electroplating process such that the conductive film layer is correspondingly formed at the region where the at least one through hole is located, and the at least one through hole is filled by the conductive film layer.

7. The method according to claim 6, wherein the forming a pixel driving circuit and a display structure on the base substrate structure sequentially comprises:
forming the pixel driving circuit on a side of the buffer layer away from the insulation layer and forming the display structure on the pixel driving circuit.

8. The method according to claim 7, wherein after the forming a pixel driving circuit and a display structure on the base substrate structure sequentially, the method further comprises:

turning over the substrate, and attaching the display structure to a UV curable adhesive such that the UV curable adhesive is arranged on a side of the display structure away from the base substrate structure; and     separating the substrate from the base substrate structure by a laser lift-off process.

9. The method according to claim 6, wherein after the peripheral circuit is coupled to the pixel driving circuit through the at least one through hole, the method further comprises:

separating the display structure from the UV curable adhesive by UV illumination.

10. The method according to claim 6, wherein after the forming an insulation layer and a buffer layer on the substrate sequentially and before the forming a pixel driving circuit and a display structure on the base substrate structure sequentially, the method further comprises:

turning over the substrate, and attaching the buffer layer to a UV curable adhesive such that the UV curable adhesive is arranged on a side of the buffer layer away from the insulation layer; and     separating the substrate from the base substrate structure by a laser lift-off process.

11. The method according to claim 6, wherein after the forming a peripheral circuit on a side of the base substrate structure away from the display structure and before the forming a pixel driving circuit and a display structure on the base substrate structure sequentially, the method further comprises:

separating the buffer layer from the UV curable adhesive by UV illumination.

12. The method according to claim 6, wherein the conductive seed layer is made of Ti, Mo, Ta, Al, Cu, Ag, Mo alloy, Cu alloy or AL alloy.

13. The method according to claim 12, wherein the forming at least one through hole in the base substrate structure comprises:

forming a plurality of through holes in the base substrate structure such that the plurality of through holes are respectively disposed in the plurality of opaque regions.

14. The method according to claim 6, wherein the forming at least one through hole in the base substrate structure comprises:

forming a plurality of through holes in the base substrate structure such that the plurality of through holes are respectively disposed in the plurality of opaque regions.

\* \* \* \* \*